United States Patent
Brandl et al.

(10) Patent No.: US 10,403,333 B2
(45) Date of Patent: Sep. 3, 2019

(54) MEMORY CONTROLLER WITH FLEXIBLE ADDRESS DECODING

(71) Applicant: Advanced Micro Devices, Inc., Sunnyvale, CA (US)

(72) Inventors: Kevin M. Brandl, Austin, TX (US); Thomas Hamilton, Manor, TX (US); Hideki Kanayama, San Jose, CA (US); Kedarnath Balakrishnan, Austin, TX (US); James R. Magro, Austin, TX (US); Guanhao Shen, Austin, TX (US); Mark Fowler, Hopkinton, MA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 152 days.

(21) Appl. No.: 15/211,887

(22) Filed: Jul. 15, 2016

(65) Prior Publication Data
US 2018/0019006 A1    Jan. 18, 2018

(51) Int. Cl.
*G11C 7/10* (2006.01)
*G06F 12/1018* (2016.01)
*G11C 11/408* (2006.01)

(52) U.S. Cl.
CPC ........ *G11C 7/1063* (2013.01); *G06F 12/1018* (2013.01); *G11C 7/1072* (2013.01);
(Continued)

(58) Field of Classification Search
None
See application file for complete search history.

(56) References Cited

U.S. PATENT DOCUMENTS

| 9,432,298 B1 * | 8/2016 | Smith | H04L 49/9057 |
| 2009/0006718 A1 * | 1/2009 | Blumrich | G06F 12/0804 |
| | | | 711/103 |

(Continued)

FOREIGN PATENT DOCUMENTS

EP    1653364 A2    5/2006

OTHER PUBLICATIONS

International Search Report and Written Opinion for International Application No. PCT/US2016/053358, dated Apr. 14, 2017, 12 pages.

*Primary Examiner* — Ann J Lo
*Assistant Examiner* — Brett P Lohmeier
(74) *Attorney, Agent, or Firm* — Polansky & Associates, P.L.L.C.; Paul J. Polansky

(57) ABSTRACT

A memory controller includes a host interface for receiving memory access requests including access addresses, a memory interface for providing memory accesses to a memory system, and an address decoder coupled to the host interface for programmably mapping the access addresses to selected ones of a plurality of regions. The address decoder is programmable to map the access addresses to a first region having a non-power-of-two size using a primary decoder and a secondary decoder each having power-of-two sizes, and providing a first region mapping signal in response. A command queue stores the memory access requests and region mapping signals. An arbiter picks the memory access requests from the command queue based on a plurality of criteria, which are evaluated based in part on the region mapping signals, and provides corresponding memory accesses to the memory interface in response.

23 Claims, 9 Drawing Sheets

(52) U.S. Cl.
CPC .... *G11C 11/408* (2013.01); *G06F 2212/1041* (2013.01); *G11C 7/10* (2013.01)

(56) References Cited

U.S. PATENT DOCUMENTS

| | | | |
|---|---|---|---|
| 2009/0024777 A1* | 1/2009 | Hirotsu | G06F 13/366 710/116 |
| 2009/0132773 A1 | 5/2009 | Natarajan et al. | |
| 2010/0042759 A1* | 2/2010 | Srinivasan | G06F 12/0607 710/35 |
| 2012/0137090 A1* | 5/2012 | Biswas | G06F 12/0638 711/157 |
| 2014/0192583 A1* | 7/2014 | Rajan | G11C 7/10 365/63 |
| 2015/0089168 A1 | 3/2015 | Kalyanasundharam et al. | |
| 2015/0221358 A1* | 8/2015 | Brandl | G11C 11/4087 365/222 |
| 2016/0098318 A1 | 4/2016 | Cohen et al. | |

\* cited by examiner

MEMORY CONTROLLER WITH FLEXIBLE ADDRESS DECODING

FIELD

This disclosure relates generally to data processing systems, and more specifically to data processing systems with memory controllers that can interface to memories having variable sizes.

BACKGROUND

Computer systems typically use inexpensive and high density dynamic random access memory (DRAM) chips for main memory. Most DRAM chips sold today are compatible with various double data rate (DDR) DRAM standards promulgated by the Joint Electron Devices Engineering Council (JEDEC). As JEDEC has promulgated new DDR standards, there have been significant periods in which multiple generations of DDR DRAMs, such as DDR3 and DDR4, are popular. In addition, JEDEC specifies another class of DRAM that is designed specifically for the needs of modern graphics processors, known as graphics DDR (gDDR) memory, and one generation, gDDR5, remains popular today. Thus, it is important for memory controllers to be able to flexibly interface to any one of these plus potentially other emerging memory types.

Memory controller flexibility is also important for the memory system to meet the needs of the different types of products that use it. For example, memories are typically designed with a power-of-two density to simplify layout and decoding. Memory chip densities have historically increased exponentially as modern integrated circuit lithography techniques have evolved. Thus historically DRAM sizes have evolved from 64 kilobit (64 Kb) available in the mid 1980s, to 128 Kb, to 256 Kb, and so on until the present in which DDR DRAMs are commonly available in 4-, 8-, and 16-gigabit (Gb) densities. There are two reasons why this trend may not continue. First, semiconductor lithography technology may be approaching physical limits. Thus memory manufacturers may offer intermediate sizes that are not power-of-two. Second, designers may need memory having densities that are not close to the nearest power of two size, and may not want the extra product cost that comes with the next higher density. Thus memory manufacturers have started designing non power-of-two memory sizes to better meet these realities. Interfacing to non power-of-two memories places additional burdens on memory controller manufacturers to design the circuitry that meets all possible configurations without excessive cost.

Memory systems operate more efficiently if the memory controller is able to access different banks in an interleaved fashion without causing page conflicts. By interleaving accesses to different banks, the memory controller is able to partially hide the overhead that would be required for a series of accesses to different rows in the same bank. Known memory controllers use a circuit that scrambles or "swizzles" the input address so that sequential accesses to the same rank and bank will be spread across multiple banks. For example, the memory controller uses certain address bits to scramble the bank address so that memory accesses in a relatively small region of the address space are mapped to different banks. The bank scramble algorithm implemented by this memory controller provides a pattern of accesses with a desirable level of interleaving for some systems but not for others, depending on the type of system, the characteristics of the accesses generated by the application program and the operating system, etc.

Figure 1:
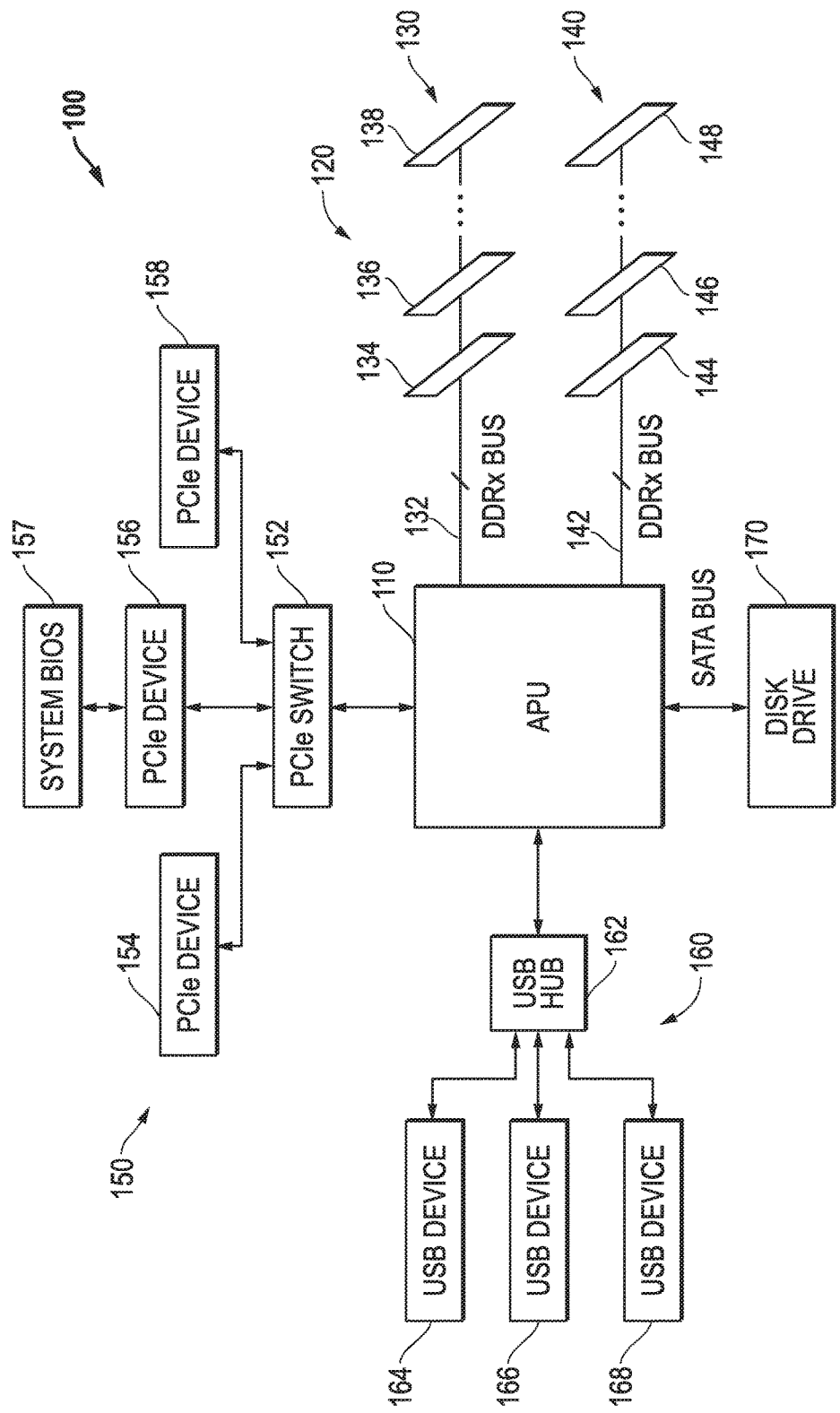
FIG. 1 illustrates in block diagram form a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a memory controller includes a host interface for receiving memory access requests, the memory access requests including access addresses, a memory interface for providing memory accesses to a memory system, an address decoder, a command queue, and an arbiter. The address decoder is coupled to the host interface for programmably mapping the access addresses to selected ones of a plurality of regions using a hashing function. The address decoder is responsive to a plurality of programmable bits to determine which of a corresponding plurality of bits of the access addresses are used in the hashing function, and is programmable to map the access addresses to a first region having a non-power-of-two size using a primary decoder having a first powerof-two size and a secondary decoder having a second power-of-two size. The command queue is coupled to the address decoder for storing the memory access requests and region mapping signals. The arbiter is for picking the memory access requests from the command queue based on a plurality of criteria, the plurality of criteria evaluated based in part on the region mapping signals, and providing corresponding memory accesses to the memory interface in response.

For example the address decoder may include a plurality of region decoders, in which the region corresponds to chip select signals of the memory system. Each region decoder may include both a primary decoder and a secondary decoder. The primary decoder is for receiving the access addresses and providing a primary region select signal, and has a first base address and a first power-of-two size. The secondary decoder is for receiving the access addresses and providing a secondary region select signal, wherein the secondary decoder has a second base address and a second power-of-two size. The region decoder further includes a logic circuit for activating a corresponding region mapping signal in response to an activation of at least one of the primary region select signal and the secondary region select signal. For example the region may have a size of $2^N+2^{(N-1)}$, in which the primary decoder decodes a region size of $2^N$ and the secondary decoder decodes a region size of $2^{(N-1)}$. In this way the region could have a size of, for example, 6 gigabytes (6 GB) implemented with two compact power-of-two decoders.

In another example, the memory controller further includes a first region decoder and a second region decoder. The first region decoder is for selectively mapping the access addresses to a first region having a power-of-two size using a first primary decoder having a third power-of-two size and a first secondary decoder having the third power-of-two size, and providing the first region mapping signal in response. The second region decoder is for selectively mapping the access addresses to a second region having a power-of-two size using a second primary decoder having the third power-of-two size and a second secondary decoder having the third power-of-two size, and providing a second region mapping signal in response. The memory controller interleaves a memory space corresponding to the access addresses among each of the first primary decoder, the second primary decoder, the first secondary decoder, and the second secondary decoder.

In another form, an apparatus has a memory controller including a host interface, a memory interface, an address decoder, a command queue, and an arbiter. The host interface is for receiving memory access requests, the memory access requests including access addresses. The memory interface is for providing memory accesses to a memory system. The address decoder is coupled to the host interface for programmably mapping the access addresses to selected ones of a plurality of regions, wherein the address decoder is programmable to map the access addresses to a first region having a non-power-of-two size using a primary decoder having a first power-of-two size and a secondary decoder having a second power-of-two size, and provides a first region mapping signal in response. The command queue is coupled to the address decoder for storing the memory access requests and region mapping signals. The arbiter is for picking the memory access requests from the command queue based on a plurality of criteria, the plurality of criteria evaluated based in part on the region mapping signals, and providing corresponding memory accesses to the memory interface in response. In yet another form an apparatus having a memory controller includes a host interface, a memory interface, an address decoder, a command queue, and an arbiter. The host interface is for receiving memory access requests, the memory access requests including access addresses. The memory interface is for providing memory accesses to a memory system, the memory accesses including hashed addresses. The address decoder is coupled to the host interface for programmably mapping the access addresses to selected ones of a plurality of regions of the memory system using a hashing function, wherein the address decoder is responsive to a plurality of programmable bits to determine which of a corresponding plurality of bits of the access addresses are used in the hashing function. The command queue is coupled to the address decoder for storing the memory access requests including the hashed addresses. The arbiter is for picking the memory access requests from the command queue based on a plurality of criteria, and providing corresponding memory accesses including the hashed addresses to the memory interface in response.

In yet another form, a method includes receiving memory access requests, the memory access requests including access addresses. The access addresses are decoded and corresponding region mapping signals are provided in response. The decoding includes selectively mapping the access addresses to a first region having a non-power-of-two size using a first primary decoder having a first power-of-two size and a first secondary decoder having a second power-of-two size. The first region mapping signal is provided in response to mapping the access addresses to the first region. The memory access requests and region mapping signals are stored, and the memory access requests, so stored, are picked based on a plurality of criteria, in which the plurality of criteria are evaluated based in part on the region mapping signals. Corresponding memory accesses are provided in response to picked memory access requests.

In still another form, a method includes receiving memory access requests, the memory access requests including access addresses. The access addresses are decoded and corresponding region mapping signals are provided in response, wherein the decoding includes selectively hashing the access addresses using a hashing function responsive to a plurality of programmable bits to determine which of a corresponding plurality of bits of the access addresses are used in the hashing function. The region mapping signals are provided in response to the decoding. The memory access requests and the region mapping signals are stored, and the memory access requests, so stored, are picked based on a plurality of criteria, the plurality of criteria evaluated based in part on the region mapping signals. Corresponding memory accesses are provided in response to picked memory access requests.

FIG. 1 illustrates in block diagram form a data processing system 100 according to some embodiments. Data processing system 100 includes a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks. Likewise memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Figure 2:
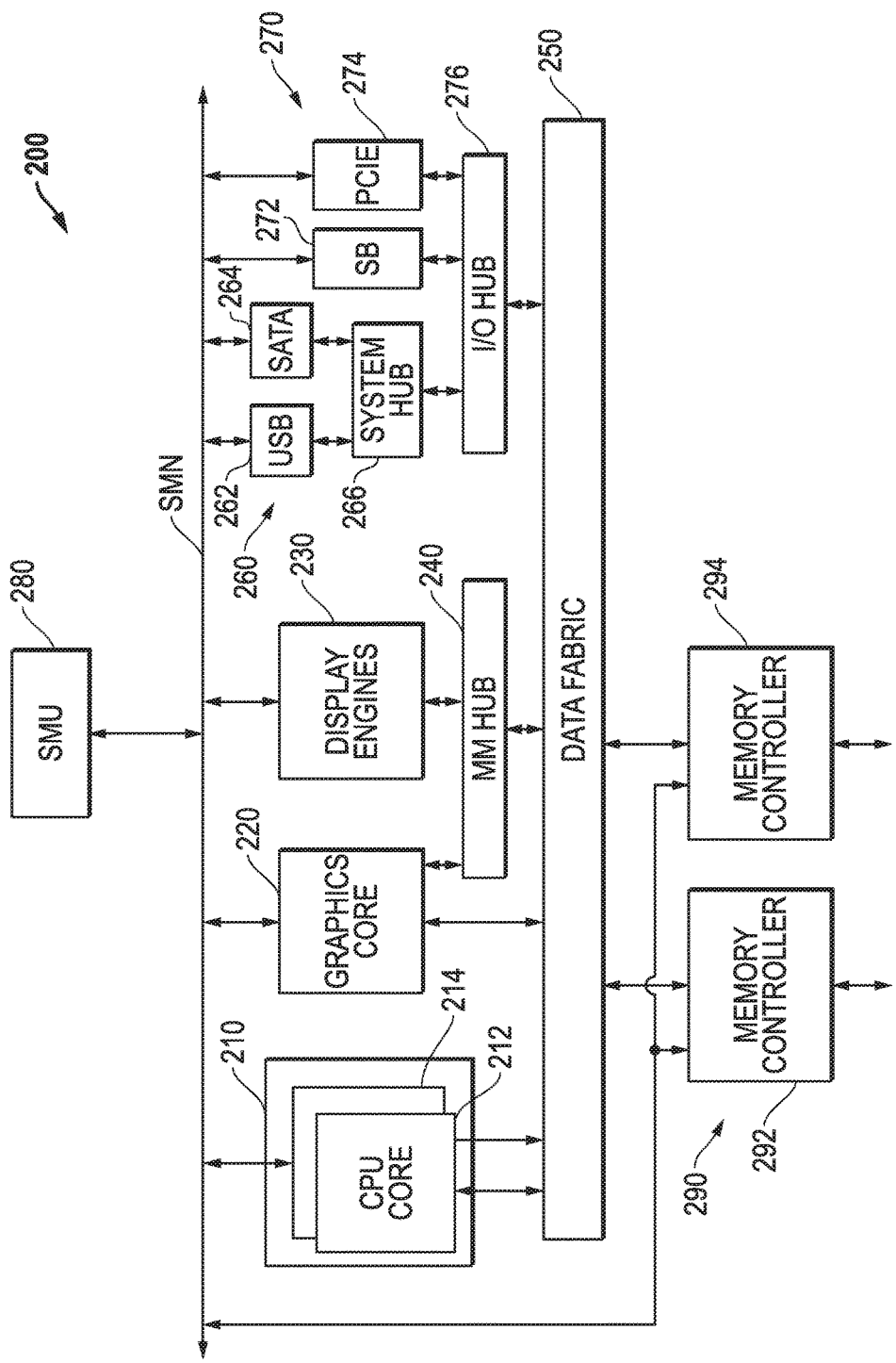
FIG. 2 illustrates in block diagram form an accelerated processing unit (APU) suitable for use in the data processing system of FIG. 1.

FIG. 2 illustrates in block diagram form an APU 200 suitable for use in data processing system 100 of FIG. 1. APU 200 includes a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290.

CPU core complex 210 includes a CPU core 212 and a CPU core 214. In this example, CPU core complex 210 includes two CPU cores, but in other embodiments CPU core complex can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

APU 200 also implements various system monitoring and power saving functions. In particular one system monitoring function is thermal monitoring. For example, if APU 200 becomes hot, then SMU 280 can reduce the frequency and voltage of CPU cores 212 and 214 and/or graphics core 220. If APU 200 becomes too hot, then it can be shut down entirely. Thermal events can also be received from external sensors by SMU 280 via the SMN bus, and SMU 280 can reduce the clock frequency and/or power supply voltage in response.

Figure 3:
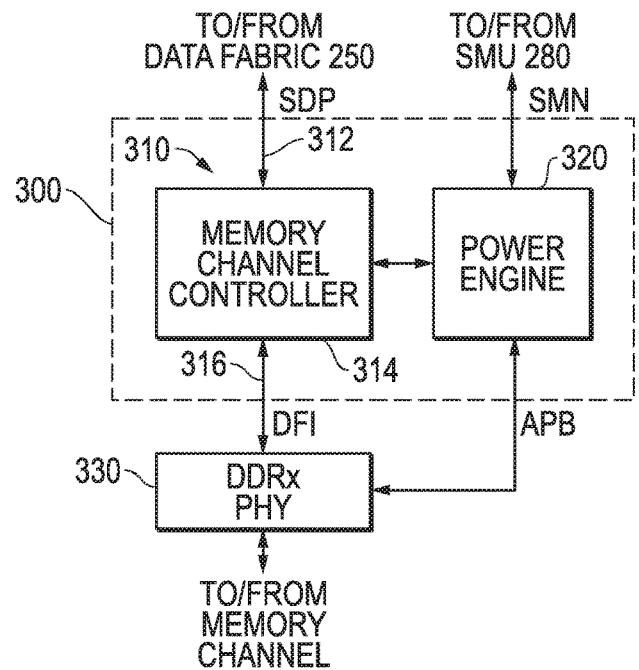
FIG. 3 illustrates in block diagram form a memory controller and associated physical interface (PHY) suitable for use in the APU of FIG. 2 according to some embodiments.

FIG. 3 illustrates in block diagram form a memory controller 300 and an associated physical interface (PHY) 330 suitable for use in APU 200 of FIG. 2 according to some embodiments. Memory controller 300 includes a memory channel 310 and a power engine 320. Memory channel 310 includes a host interface 312, a memory channel controller 314, and a physical interface 316. Host interface 312 bidirectionally connects memory channel controller 314 to data fabric 250 over a scalable data port (SDP). Physical interface 316 bidirectionally connects memory channel controller 314 to PHY 330 over a bus that conforms to the DDR-PHY Interface Specification (DFI). Power engine 320 is bidirectionally connected to SMU 280 over the SMN bus, to PHY 330 over the Advanced Peripheral Bus (APB), and is also bidirectionally connected to memory channel controller 314. PHY 330 has a bidirectional connection to a memory channel such as memory channel 130 or memory channel 140 of FIG. 1. Memory controller 300 is an instantiation of a memory controller for a single memory channel using a single memory channel controller 314, and has a power engine 320 to control operation of memory channel controller 314 in a manner that will be described further below.

Figure 4:
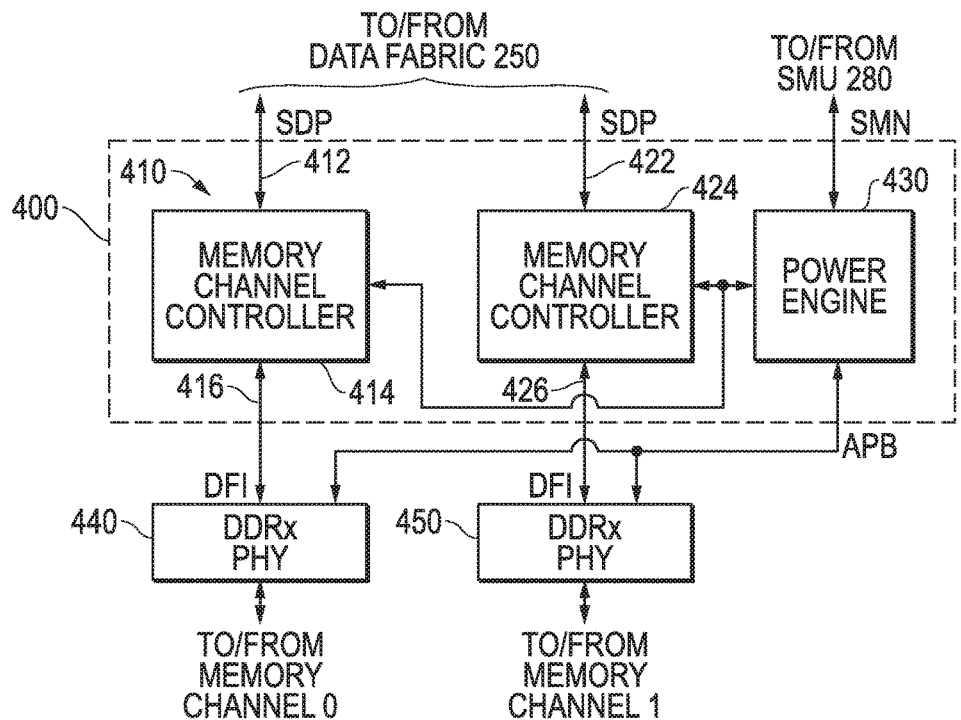
FIG. 4 illustrates in block diagram form another memory controller and associated PHY suitable for use in the APU of FIG. 2 according to some embodiments.

FIG. 4 illustrates in block diagram form another memory controller 400 and associated PHYs 440 and 450 suitable for use in APU 200 of FIG. 2 according to some embodiments. Memory controller 400 includes memory channels 410 and 420 and a power engine 430. Memory channel 410 includes a host interface 412, a memory channel controller 414, and a physical interface 416. Host interface 412 bidirectionally connects memory channel controller 414 to data fabric 250 over an SDP. Physical interface 416 bidirectionally connects memory channel controller 414 to PHY 440, and conforms to the DFI Specification. Memory channel 420 includes a host interface 422, a memory channel controller 424, and a physical interface 426. Host interface 422 bidirectionally connects memory channel controller 424 to data fabric 250 over another SDP. Physical interface 426 bidirectionally connects memory channel controller 424 to PHY 450, and conforms to the DFI Specification. Power engine 430 is bidirectionally connected to SMU 280 over the SMN bus, to PHYs 440 and 450 over the APB, and is also bidirectionally connected to memory channel controllers 414 and 424. PHY 440 has a bidirectional connection to a memory channel such as memory channel 130 of FIG. 1. PHY 450 has a bidirectional connection to a memory channel such as memory channel 140 of FIG. 1. Memory controller 400 is an instantiation of a memory controller having two memory channel controllers and uses a shared power engine 430 to control operation of both memory channel controller 414 and memory channel controller 424 in a manner that will be described further below.

Figure 5:
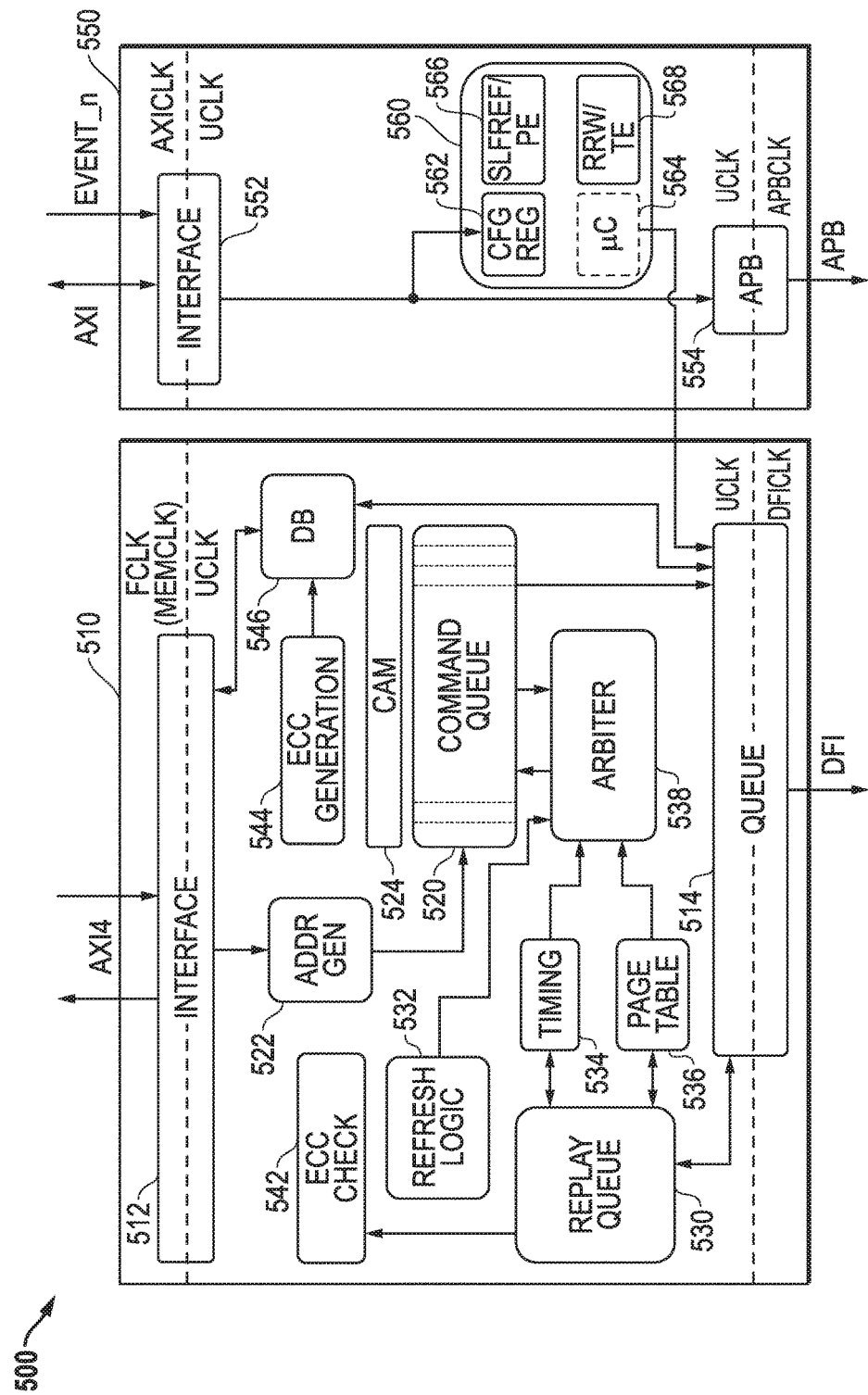
FIG. 5 illustrates in block diagram form a memory controller according to some embodiments.

FIG. 5 illustrates in block diagram form a memory controller 500 according to some embodiments. Memory controller 500 includes a memory channel controller 510 and a power controller 550. Memory channel controller 510 includes an interface 512, a queue 514, a command queue 520, an address generator 522, a content addressable memory (CAM) 524, a replay queue 530, a refresh logic block 532, a timing block 534, a page table 536, an arbiter 538, an error correction code (ECC) check block 542, an ECC generation block 544, and a data buffer (DB) 546.

Interface 512 has a first bidirectional connection to data fabric 250 over an external bus, and has an output. In memory controller 500, this external bus is compatible with the advanced extensible interface version four specified by ARM Holdings, PLC of Cambridge, England, known as "AXI4", but can be other types of interfaces in other embodiments. Interface 512 translates memory access requests from a first clock domain known as the FCLK (or MEMCLK) domain to a second clock domain internal to memory controller 500 known as the UCLK domain. Similarly, queue 514 provides memory accesses from the UCLK domain to the DFICLK domain associated with the DFI interface.

Address generator 522 decodes addresses of memory access requests received from data fabric 250 over the AXI4 bus. The memory access requests include access addresses in the physical address space represented in a normalized format. Address generator 522 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group. On startup, the system BIOS queries the memory devices in memory system 120 to determine their size and configuration, and programs a set of configuration registers associated with address generator 522. Address generator 522 uses the configuration stored in the configuration registers to translate the normalized addresses into the appropriate format. Command queue 520 is a queue of memory access requests received from the memory accessing agents in data processing system 100, such as CPU cores 212 and 214 and graphics core 220. Command queue 520 stores the address fields decoded by address generator 522 as well other address information that allows arbiter 538 to select memory accesses efficiently, including access type and quality of service (QoS) identifiers. CAM 524 includes information to enforce ordering rules, such as write after write (WAW) and read after write (RAW) ordering rules.

Replay queue 530 is a temporary queue for storing memory accesses picked by arbiter 538 that are awaiting responses, such as address and command parity responses, write cyclic redundancy check (CRC) responses for DDR4 DRAM or write and read CRC responses for gDDR5 DRAM. Replay queue 530 accesses ECC check block 542 to determine whether the returned ECC is correct or indicates an error. Replay queue 530 allows the accesses to be replayed in the case of a parity or CRC error of one of these cycles.

Refresh logic 532 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic 532 generates refresh commands periodically to prevent data errors caused by leaking of charge off storage capacitors of memory cells in DRAM chips. In addition, refresh logic 532 periodically calibrates ZQ to prevent mismatch in on-die termination resistance due to thermal changes in the system.

Arbiter 538 is bidirectionally connected to command queue 520 and is the heart of memory channel controller 510. It improves efficiency by intelligent scheduling of accesses to improve the usage of the memory bus. Arbiter 538 uses timing block 534 to enforce proper timing relationships by determining whether certain accesses in command queue 520 are eligible for issuance based on DRAM timing parameters. For example, each DRAM has a minimum specified time between activate commands, known as "$t_{RC}$". Timing block 534 maintains a set of counters that determine eligibility based on this and other timing parameters specified in the JEDEC specification, and is bidirectionally connected to replay queue 530. Page table 536 maintains state information about active pages in each bank and rank of the memory channel for arbiter 538, and is bidirectionally connected to replay queue 530.

In response to write memory access requests received from interface 512, ECC generation block 544 computes an ECC according to the write data. DB 546 stores the write data and ECC for received memory access requests. It outputs the combined write data/ECC to queue 514 when arbiter 538 picks the corresponding write access for dispatch to the memory channel.

Power controller 550 includes an interface 552 to an advanced extensible interface, version one (AXI), an APB interface 554, and a power engine 560. Interface 552 has a first bidirectional connection to the SMN, which includes an input for receiving an event signal labeled "EVENT_n" shown separately in FIG. 5, and an output. APB interface 554 has an input connected to the output of interface 552, and an output for connection to a PHY over an APB. Power engine 560 has an input connected to the output of interface 552, and an output connected to an input of queue 514. Power engine 560 includes a set of configuration registers 562, a microcontroller (µC) 564, a self refresh controller (SLFREF/PE) 566, and a reliable read/write timing engine (RRW/TE) 568. Configuration registers 562 are programmed over the AXI bus, and store configuration information to control the operation of various blocks in memory controller 500. Accordingly, configuration registers 562 have outputs connected to these blocks that are not shown in detail in FIG. 5. Self refresh controller 566 is an engine that allows the manual generation of refreshes in addition to the automatic generation of refreshes by refresh logic 532. Reliable read/write timing engine 568 provides a continuous memory access stream to memory or I/O devices for such purposes as DDR interface maximum read latency (MRL) training and loopback testing.

Memory channel controller 510 includes circuitry that allows it to pick memory accesses for dispatch to the associated memory channel. In order to make the desired arbitration decisions, address generator 522 decodes the address information into predecoded information including rank, row address, column address, bank address, and bank group in the memory system, and command queue 520 stores the predecoded information. Configuration registers 562 store configuration information to determine how address generator 522 decodes the received address information. Arbiter 538 uses the decoded address information, timing eligibility information indicated by timing block 534, and active page information indicated by page table 536 to efficiently schedule memory accesses while observing other criteria such as QoS requirements. For example, arbiter 538 implements a preference for accesses to open pages to avoid the overhead of precharge and activation commands required to change memory pages, and hides overhead accesses to one bank by interleaving them with read and write accesses to another bank. In particular during normal operation, arbiter 538 normally keeps pages open in different banks until they are required to be precharged prior to selecting a different page.

Figure 6:
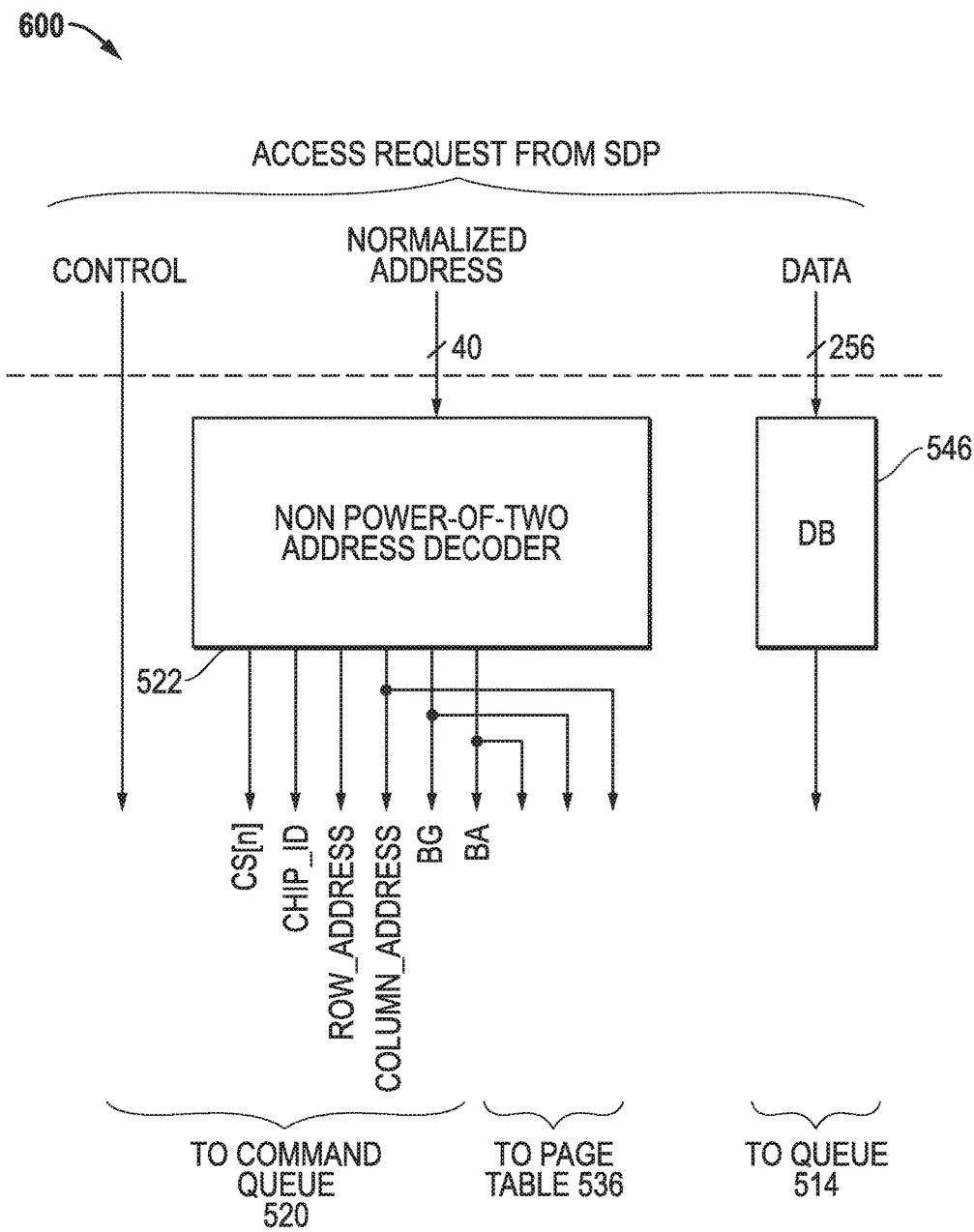
FIG. 6 illustrates in block diagram form a memory controller that can be used to implement a portion of the memory controller of FIG. 5 according to some embodiments.

FIG. 6 illustrates in block diagram form a memory controller 600 that can be used to implement a portion of memory controller 500 of FIG. 5 according to some embodiments. Memory controller 600 implements address decoder 522 of FIG. 5 as a non power-of-two address decoder 610 to accommodate non-traditional memory sizes. For example, memory controller 600 is able to receive the request from data fabric 250 and programmably map it onto non power-of-two memory sizes, such as 6 GB DIMMs. This operation will be explained in greater detail below.

Memory controller 600 has an input port for receiving memory access requests from data fabric 250 using the SDP. Each memory access request includes a set of control signals labeled "CONTROL", a 40-bit address labeled "NORMALIZED ADDRESS", and a set of 256 data signals labeled "DATA". The CONTROL signals include a tag for the access request, the size of the request, the quality of service requested, the type of access such as read or write, and so on. The NORMALIZED ADDRESS includes all of the supported address bits and is a 40-bit address with implied leading zeros appended. The DATA signals include a sufficient number of signals that are associated with a single memory access request. For example, a CPU core may include a last level cache that has a 256-bit cache line size; thus a writeback of a cache line to memory will require a 256-bit transfer. The physical interface such as PHY 330 of FIG. 3 may perform a corresponding memory access as a burst of eight to a 64-bit or 72-bit (64 bits plus 8 bits of error correcting code) DDR DIMM, but the memory controller receives all 256 DATA bits as part of the memory access request.

Memory controller 600 includes non power-of-two address decoder 610 and write data buffer 546 as previously illustrated in FIG. 5. Address decoder 610 includes an input for receiving the NORMALIZED ADDRESS, and outputs for providing a set of n chip select signals labeled "CS[n]", a set of three chip identification signals labeled "CHIP_ID", a decoded row address labeled "ROW_ADDRESS", a decoded column address labeled "COLUMN_ADDRESS", a bank group signal labeled "BG", and a bank address signal labeled "BA". Memory controller 600 provides these outputs of address decoder 610 along with the CONTROL signals to command queue 520 to allow command queue 520 to store them so that arbiter 538 can make decisions about the efficient ordering of memory access requests. Memory controller 600 also provides the COLUMN_ADDRESS, BG, and BA signals to page table 536 to allow page table 536 to associate access requests with open pages in each DRAM chip.

Write data buffer 546 is a holding buffer having an input for receiving the 256-bit DATA signal, and an output connected to an input of BEQ 514. Since data fabric 250 provides interspersed read and write memory access requests to memory controller 600, write data buffer 546 will not be used for all received memory access requests but only for writes.

In operation, the system BIOS queries the serial presence detect (SPD) ROM on each memory module of memory channels 130 and 140 at boot-up to determine their respective densities and organizations. The system BIOS uses this information to program configurable address decoder registers of address decoder 610 to define the address map for a given workload and memory chip configuration. The system BIOS also makes this information available to the operating system to allow it to program page tables used for virtual address translation from logical addresses to physical addresses, which is the format of the NORMALIZED ADDRESS. After the registers are configured by the system BIOS, address decoder 610 uses them to decode the NORMALIZED ADDRESS to map each access request to a specific region having a corresponding chip select.

For example, if the memory is DDR4 memory having a power-of two size, address decoder 522 decodes the NORMALIZED ADDRESS into various output signals as shown in TABLE I below:

TABLE I

| CS Size | Device Size, Width | BG1 | BG0 | BA1 | BA0 | Addresses |
|---|---|---|---|---|---|---|
| 1 GB | 2 Gb, x16 | x | A15 | A14 | A13 | ROW_ADDRESS = A[29:16] COLUMN_ADDRESS = A[12:3] |

TABLE I-continued

| CS Size | Device Size, Width | BG1 | BG0 | BA1 | BA0 | Addresses |
|---|---|---|---|---|---|---|
| 2 GB | 2 Gb, x8 | A16 | A15 | A14 | A13 | ROW_ADDRESS = A[30:17]<br>COLUMN_ADDRESS = A[12:3] |
| 2 GB | 4 Gb, x16 | x | A15 | A14 | A13 | ROW_ADDRESS = A[30:16]<br>COLUMN_ADDRESS = A[12:3] |
| 4 GB | 2 Gb, x4;<br>4 Gb, x8 | A16 | A15 | A14 | A13 | ROW_ADDRESS = A[31:17]<br>COLUMN_ADDRESS = A[12:3] |
| 4 GB | 8 Gb, x16 | x | A15 | A14 | A13 | ROW_ADDRESS = A[31:16]<br>COLUMN_ADDRESS = A[12:3] |
| 8 GB | 4 Gb, x4;<br>8 Gb, x8 | A16 | A15 | A14 | A13 | ROW_ADDRESS = A[32:17]<br>COLUMN_ADDRESS = A[12:3] |
| 8 GB | 16 Gb, x16 | x | A15 | A14 | A13 | ROW_ADDRESS = A[32:16]<br>COLUMN_ADDRESS = A[12:3] |
| 16 GB | 8 Gb, x4;<br>16 Gb, x8 | A16 | A15 | A14 | A13 | ROW_ADDRESS = A[33:17]<br>COLUMN_ADDRESS = A[12:3] |
| 32 GB | 16 Gb, x4 | A16 | A15 | A14 | A13 | ROW_ADDRESS = A[34:17]<br>COLUMN_ADDRESS = A[12:3] |

To operate with some DIMMs, memory controller 600 also supports a feature known as rank multiplication. In systems with rank multiplication, each packaged integrated circuit on a given DIMM includes a three-dimensional (3D) stack of memory chips interconnected using through-silicon-via (TSV) technology. For example the DDR4 standard specifies a 3-bit chip identification input signal C[2:0] to support stacks of 2, 4, and 8 memory chips. In this way each memory chip in the stack is selected by both a common chip select signal and an encoded C[2:0] signal to identify the selected logical rank within the region. To implement rank multiplication, address decoder 610 programmably decodes the NORMALIZED ADDRESS into logical ranks and activates a one-hot chip select signal for the selected region and also provides the encoded C[2:0] signal corresponding to the selected logical rank.

Address decoder 610 supports non power-of-two address decoding. The construction of address decoder 610 will now be described.

Figure 7:
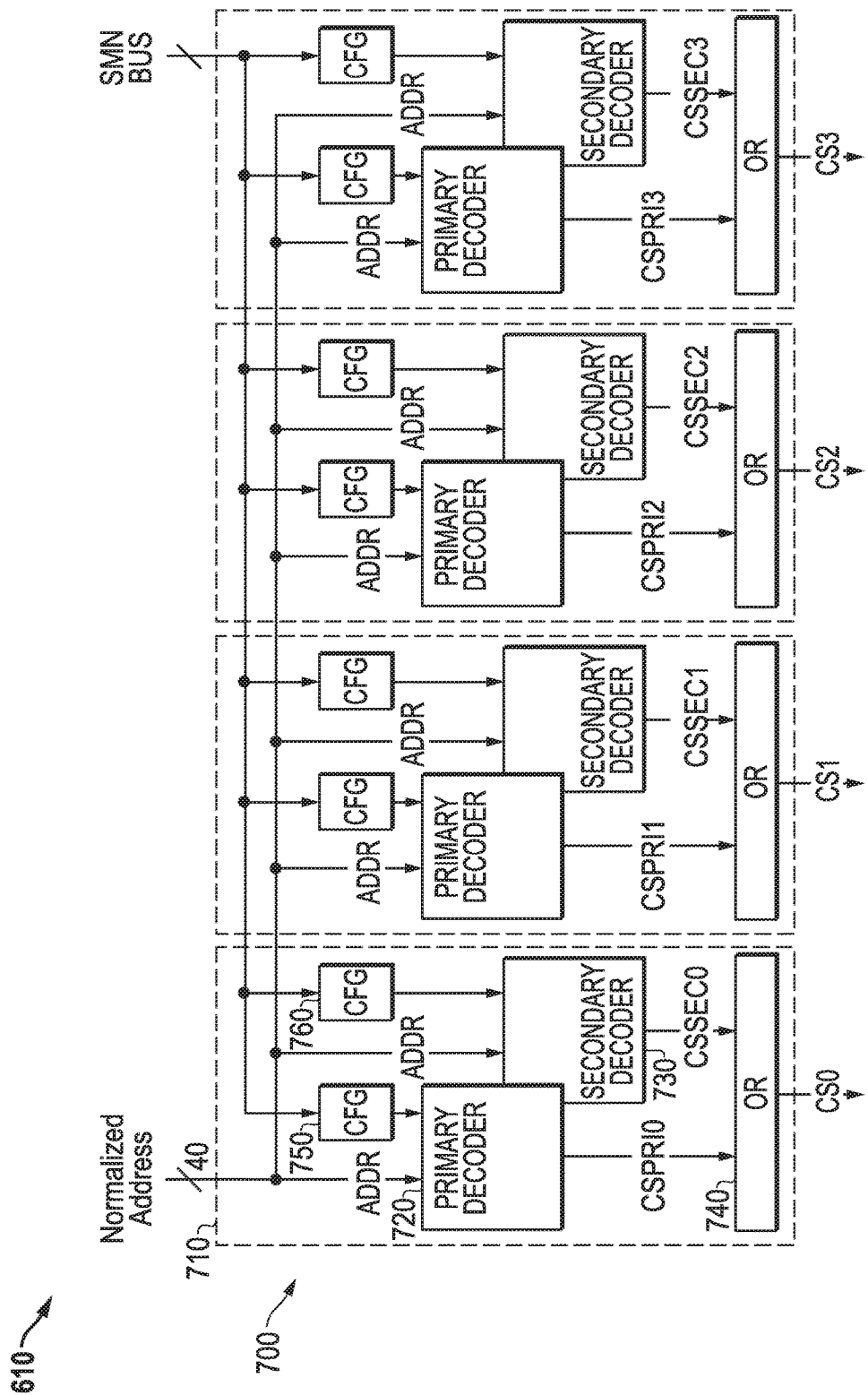
FIG. 7 illustrates in block diagram form a simplified block diagram of an address decoder that can be used as the non-power-of-two decoder of FIG. 6 according to some embodiments.

FIG. 7 illustrates in block diagram form a simplified block diagram of non-power-of-two decoder 610 of FIG. 6 according to some embodiments. Non power-of-two address decoder 610 includes a set of region decoders 700 associated with different ranks defined by a corresponding chip select signal. In the example illustrated in FIG. 7, address decoder 700 includes four region decoders 710 associated with four chip select signals respectively labeled "CS0", "CS1", "CS2", and "CS3". Each region decoder 710 includes a primary decoder 720, a secondary decoder 730, a logic circuit labeled "OR" 740, a first set of configuration registers 750 associated with primary decoder 720 labeled "CFG", and a second set of similarly labeled configuration registers 760 associated with secondary decoder 730. Note that configuration registers 750 and 760 are logically associated with primary decoder 720 and secondary decoder 730, respectively, and may either be physically distinct or may be combined with other configuration registers in a central register set such as configuration registers 562 of FIG. 5.

Each of configuration registers 750 and 760 has an input connected to the SMN bus, and an output for providing register values for use by a respective one of primary decoder 720 and secondary decoder 730. Primary decoder 720 has a first input for receiving the NORMALIZED ADDRESS, a second input connected to the output of configuration registers 750, and an output for providing a primary chip select signal. The primary chip select signals are labeled "CSPRI0", "CSPRI1", "CSPRI2", and "CSPRI3", respectively. Secondary decoder 730 has a first input for receiving the NORMALIZED ADDRESS, a second input connected to the output of configuration registers 760, and an output for providing a primary chip select signal. The primary chip select signals are labeled "CSSEC0", "CSSEC1", "CSSEC2", and "CSSEC3", respectively. Logic circuit 740 has a first input connected to the output of primary decoder 720, a second input connected to the output of secondary decoder 730, and an output for providing a respective one of signals "CS0", "CS1", "CS2", and "CS3".

Each set of configuration registers 750 and 760 includes several registers sufficient to define the attributes of the region such that the NORMALIZED ADDRESS can be decoded and mapped to the region. In one example, a base address register defines the starting address of the region and corresponds to the lowest address in the region, whereas an address mask register defines the size of the region and thus identifies significant bits to be used in the decoding. Each decoder compares the significant bits of the NORMALIZED ADDRESS, masked according to the address mask register, to the corresponding bits of the base address register. If there is a match, then the decoder outputs its respective chip select signal, and logic circuit 740 outputs a final chip select signal. For active high chip select signals, logic circuit 740 is implemented using a logical OR function.

In one embodiment, each primary decoder supports regions of size of $2^N$, and each secondary decoder supports regions of size $2^{(N-1)}$, where N is an integer. For example, if N is equal to 32, then primary decoder 720 supports a region size of 4 GB and secondary decoder supports a region size of 2 GB, for a total region size of 6 GB.

By providing both a primary and secondary decoder, assigned to the same region and combining their results, region decoder 710 supports non power-of-two memory sizes without complicated bit-by-bit decoding, thereby reducing the size of the decoders. Since each of the primary and secondary decoders have a power-of-two size, they can perform region decoding on a subset of the NORMALIZED ADDRESS bits quickly and efficiently using a compact circuit. By reducing the number of bits required in the decoding operation, address decoder 700 is able to decode addresses faster. For example a full bit-by-bit comparison of 32 bits of the 40-bit NORMALIZED ADDRESS to base and limit registers of an arbitrary region size would require more than a single clock cycle to resolve for higher clock rates using contemporary CMOS logic processes.

While address decoder 710 can be used to support non power-of-two region sizes with both a primary decoder and a secondary decoder, additional configurations are possible according to other embodiments. For example, each address decoder could include a primary decoder, a secondary decoder, and a tertiary decoder that have respective sizes of $2^N$, $2^{(N-1)}$, and $2^{(N-2)}$. For example if N is equal to 32, this configuration allows the decoding of normalized addresses into region sizes of 1-7 GB in 1 GB increments. This concept could be further extended to four or more decoders as well.

Figure 8:
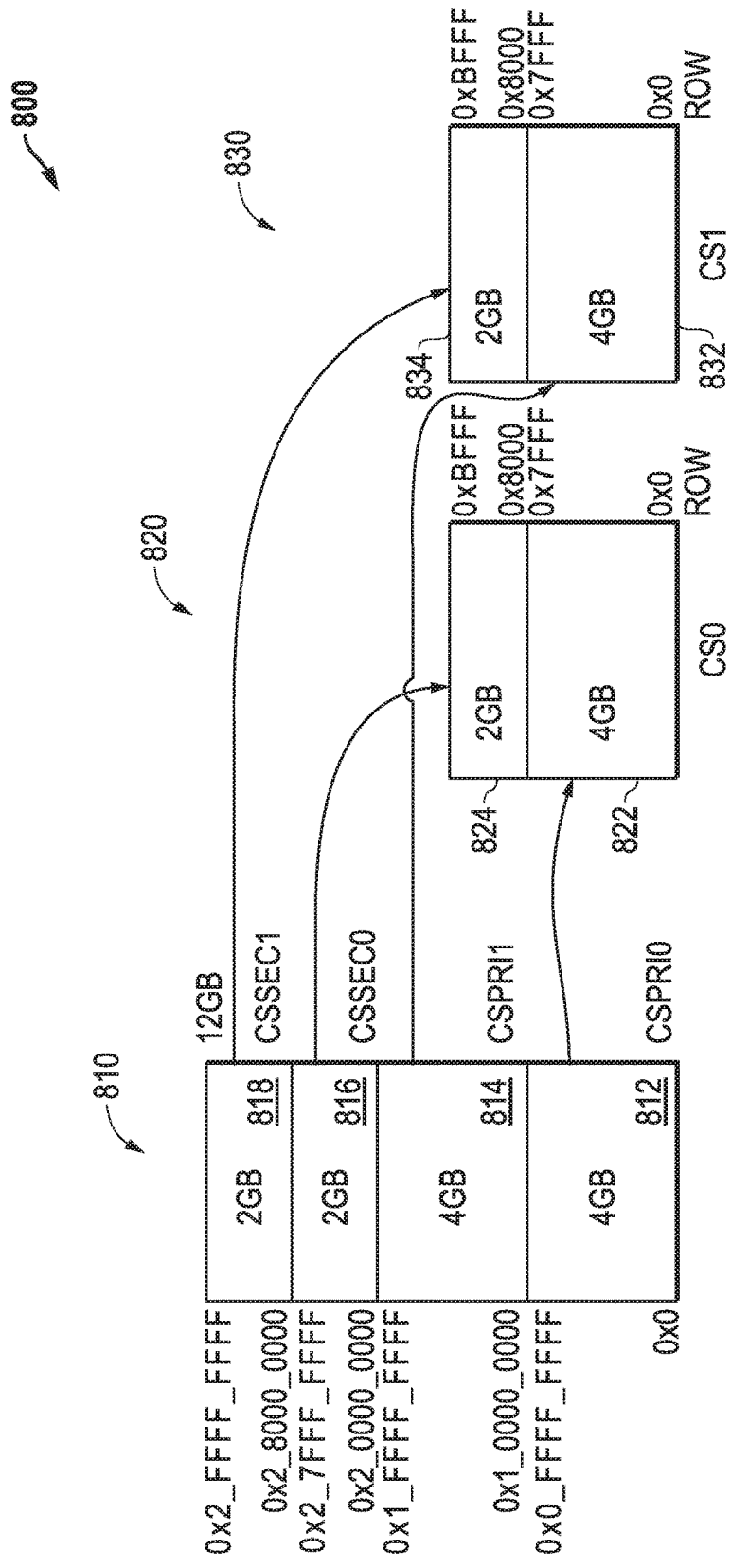
FIG. 8 illustrates a diagram showing the address mapping performed by the address decoder of FIG. 7 when programmed for a non-power-of-two address space using two region decoders.

FIG. 8 illustrates a diagram 800 showing the address mapping performed by the address decoder of FIG. 7 when programmed for a non-power-of-two address space using two region decoders. Diagram 800 includes a normalized address space 810, a first region 820, and a second region 830. Normalized address space 810 has a 4 GB sub-region 812 associated with decoded signal CSPRI0, a 4 GB sub-region 814 associated with decoder signal CSPRI1, a 2 GB sub-region 816 associated with decoded signal CSSEC0, and a 2 GB sub-region associated with decoded signal CSSEC1. Sub-region 812 starts at address 0x0 and extends to address 0x0_FFFF_FFFF, which is 4 G–1 ($2^{32}$–1), in which 0x indicates a 40-bit hexadecimal address with implied leading zeros. Sub-region 814 starts at address 0x1_0000_0000 ($2^{32}$) and extends to address 0x1_FFFF_FFFF, which is 8 G–1 ($2^{32}+2^{32}$–1). Sub-region 816 starts at address 0x2_0000_0000 (8 G) and extends to address 0x2_7FFF_FFFF (10 G–1). Sub-region 818 starts at address 0x2_8000_0000 (10 G) and extends to address 0x2_FFFF_FFFF (12 G–1). First region 820 is a 6 GB region associated with CS0 and has a 4 GB primary portion 822 and a 2 GB secondary portion 824. First region 820 is implemented with 48K (49,152) rows of 128K (131,072) bytes each, in which a primary region 822 is implemented with 32K (32,768) rows extending from row address 0x0 to row address 0x7FFF, and a secondary region 824 is implemented with 16K rows extending from row address 0x8000 to 0xbFFF. Likewise second region 830 is implemented with 48K rows of 128K bytes each, in which a primary region 832 is implemented with 32K rows extending from row address 0x0 to row address 0x7FFF, and a secondary region 834 is implemented with 16K rows extending from row address 0x8000 to 0xbFFF.

To perform this decoding operation, the system BIOS programs configuration registers as shown in TABLE II:

TABLE II

| Register Name | Register Function | Value |
| --- | --- | --- |
| BaseAddrCS0[39:8] | Base address register for CS0 primary decoder | 0x0_0000_00 |
| BaseAddrCS1[39:8] | Base address register for CS1 primary decoder | 0x1_0000_00 |
| BaseAddrSecCS0[39:8] | Base address register for CS0 secondary decoder | 0x2_0000_00 |
| BaseAddrSecCS1[39:8] | Base address register for CS1 primary decoder | 0x2_8000_00 |
| AddrMaskCS01[39:8] | Address mask for primary decoders for CS0 and CS1 | 0x0_FFFF_FF |
| AddrMaskSecCS01[39:8] | Address mask for secondary decoders for CS0 and CS1 | 0x0_7FFF_FF |

Note
that bits [7:0] represent byte addressing of 256 bytes. These bits are dropped for implementation convenience, and are inferred as 0 for Base registers and 1 for Mask registers.

Memory Access Interleaving

Known memory controllers use an additional interleaving mode known as bank swizzle mode in which certain bits of the input address are decoded to form the bank address. These particular bits include certain bits of the access address such as low-order row address bits to generate new bank (or in the case of DDR4 both bank and bank group) bits. In this way different portions of a set of contiguous addresses that would have otherwise caused page conflicts are divided between banks, resulting in greater efficiency.

According to some embodiments, a memory controller as described herein includes programmable mechanisms to interleave the physical address space across a set of distinct regions. In this way, a memory controller as described above, for example memory controller 292 or 294 of FIG. 2 or memory controller 500 of FIG. 5, can operate more efficiently by spreading a series of accesses that may be encountered during execution of a program across multiple ranks of DRAM. Thus overhead cycles such as page pre-charges and page activates can be hidden within useful cycles. The first mechanism is chip select interleaving that can be accomplished using the primary and secondary region decoders.

Figure 9:
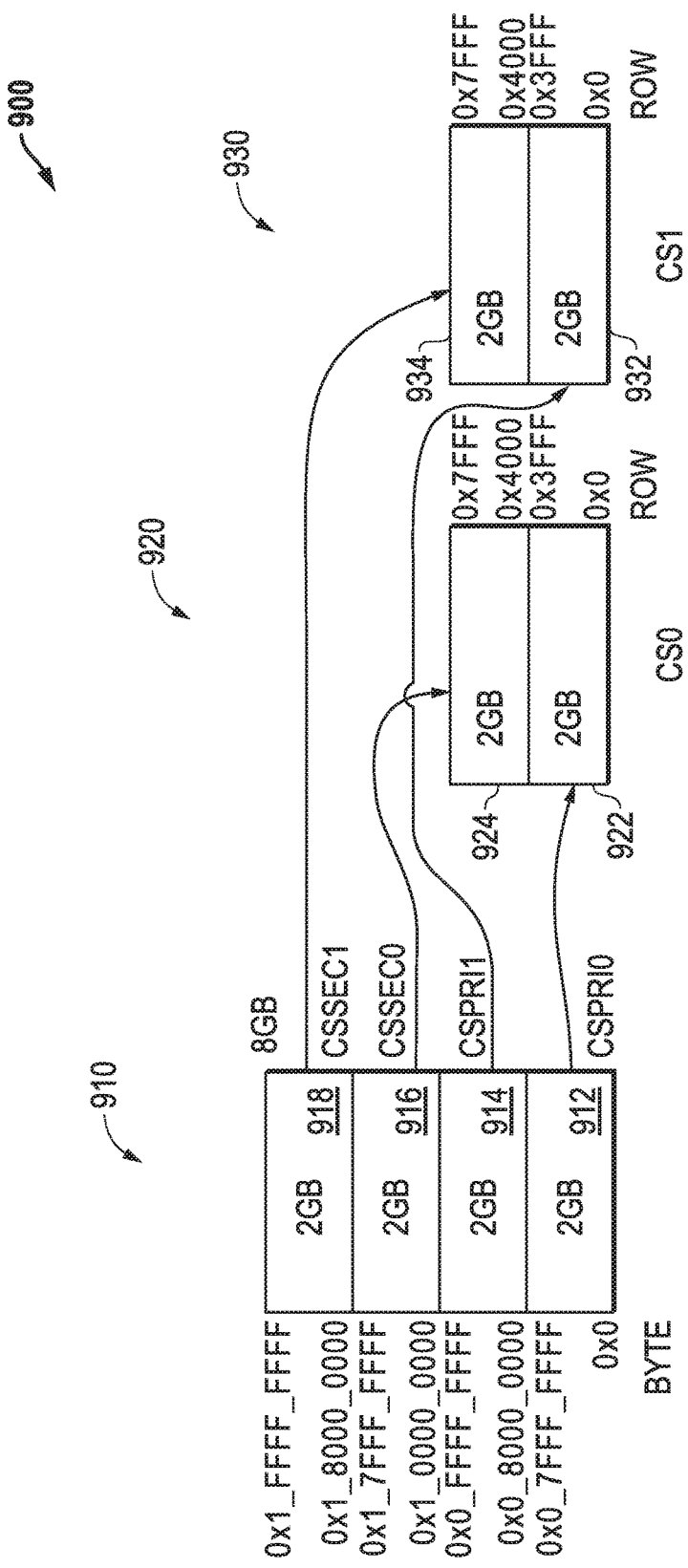
FIG. 9 illustrates a diagram showing the address mapping performed by the address decoder of FIG. 7 when programmed to implement chip select interleave according to some embodiments.

FIG. 9 illustrates a diagram 900 showing the address mapping performed by the address decoder of FIG. 7 when programmed to implement chip select interleave using two address decoders according to some embodiments. Diagram 900 includes a normalized address space 910, a first region 920, and a second region 930. Normalized address space 910 has a 2 GB sub-region 912 associated with decoded signal CSPRI0, a 2 GB sub-region 914 associated with decoder signal CSPRI1, a 2 GB sub-region 916 associated with decoded signal CSSEC0, and a 2 GB sub-region 918 associated with decoded signal CSSEC1. Sub-region 912 starts at address 0x0 and extends to address 0x0_7FFF_FFFF, which is 2 G–1 ($2^{31}$–1). Sub-region 914 starts at address 0x8_0000_0000 ($2^{31}$) and extends to address 0x0_FFFF_FFFF, which is 4 G–1 ($2^{31}+2^{31}$–1). Sub-region 916 starts at address 0x1_0000_0000 (4 GB) and extends to address 0x1_7FFF_FFFF (6 G–1). Sub-region 918 starts at address 0x1_8000_0000 (6 G) and extends to address 0x1_FFFF_FFFF (8 G–1). First region 920 is a 4 GB region associated with CS0 and has a 2 GB portion 922 and a 2 GB portion 924. First region 920 is implemented with 16K rows of 128K bytes each, in which a primary region 922 is implemented with 16K rows extending from row address 0x0 to row address 0x3FFF, and a secondary region 924 is implemented with 16K rows extending from row address 0x4000 to 0x7FFF. Likewise second region 930 is implemented with 16K rows of 128K bytes each, in which a primary region 932 is implemented with 16K rows extending from row address 0x0 to row address 0x3FFF, and a secondary region 934 is implemented with 16K rows extending from row address 0x4000 to 0x7FFF.

In the chip select interleave mode, memory controller 600 interleaves the physical address space over multiple DIMM ranks on a channel, as opposed to a single DIMM rank occupying a contiguous set of addresses in the normalized address space. Chip select (CS) interleave reduces page conflicts as potentially more DRAM banks can be used over a smaller address region, effectively making more DRAM banks available. To use chip select interleave, there are two requirements. First, the number of interleaved chip select signals is a power of two. Second, the regions are the same size. In the example in FIG. 9, there are two ($2^1$) chip selects for two regions having the same size (4 GB).

Memory controller 600 programmably implements chip select interleave by swapping upper order normalized address bits used to select a region and chip select signal with lower order bits of the normalized address corresponding to the desired interleave size. CS interleave mode can be configured by setting the BaseAddrCS and AddrMaskCS registers to indicate the size of interleave. For example, if interleaving only the primary decoders and then only the secondary decoders on a 1024 KB normalized address range in a two-CS system, the register settings will be as shown in TABLE III below:

TABLE III

| Register Name | Register Function | Original Map | Interleaved Map |
| --- | --- | --- | --- |
| BaseAddrCS0[39:8] | Base address register for CS0 primary decoder | 0x0_0000_00 | 0x0_0000_00 |
| BaseAddrCS1[39:8] | Base address register for CS1 primary decoder | 0x0_8000_00 | 0x0_0000_10 |
| BaseAddrSecCS0[39:8] | Base address register for CS0 secondary decoder | 0x1_0000_00 | 0x1_0000_00 |
| BaseAddrSecCS1[39:8] | Base address register for CS1 primary decoder | 0x1_8000_00 | 0x1_0000_10 |
| AddrMaskCS01[39:8] | Address mask for primary decoders for CS0 and CS1 | 0x0_7FFF_FF | 0x0_FFFF_EF |
| AddrMaskSecCS01[39:8] | Address mask for secondary decoders for CS0 and CS1 | 0x0_7FFF_FF | 0x0_7FFF_EF |

Thus regions 912 and 914 are now two-way interleaved across addresses 0x0 to 0x0_FFFF_FFFF, and address bit 12 determines whether CS0 or CS1 is used. Likewise, regions 916 and 918 are also two-way interleaved across addresses 0x1_0000_0000 to 0x1_FFFF_FFFF, and address bit 12 again determines whether CS0 or CS1 is used.

In the example shown in TABLE I, address bit A[12] (corresponding to a size of 1024 KB) was mapped to column address bit 9 (COL[9]). This mapping allows the firmware additional flexibility when implementing interleaving. In the current example A[12] is used for CS interleaving, and COL[9] is mapped instead to A[13], and higher order address bits are used for bank and bank group addresses, namely A[14] for BA0, A[15] for BA1, etc. according to the pattern of TABLE I.

The second mechanism is known as hashing. Hashing provides a finer granularity by allowing more address bits to be used. The number and location of the address bits used in hashing can be programmed by the user, providing flexibility so that the hashing operation can be tailored for the specific application and the characteristics of the software code.

Figures 10, 11:
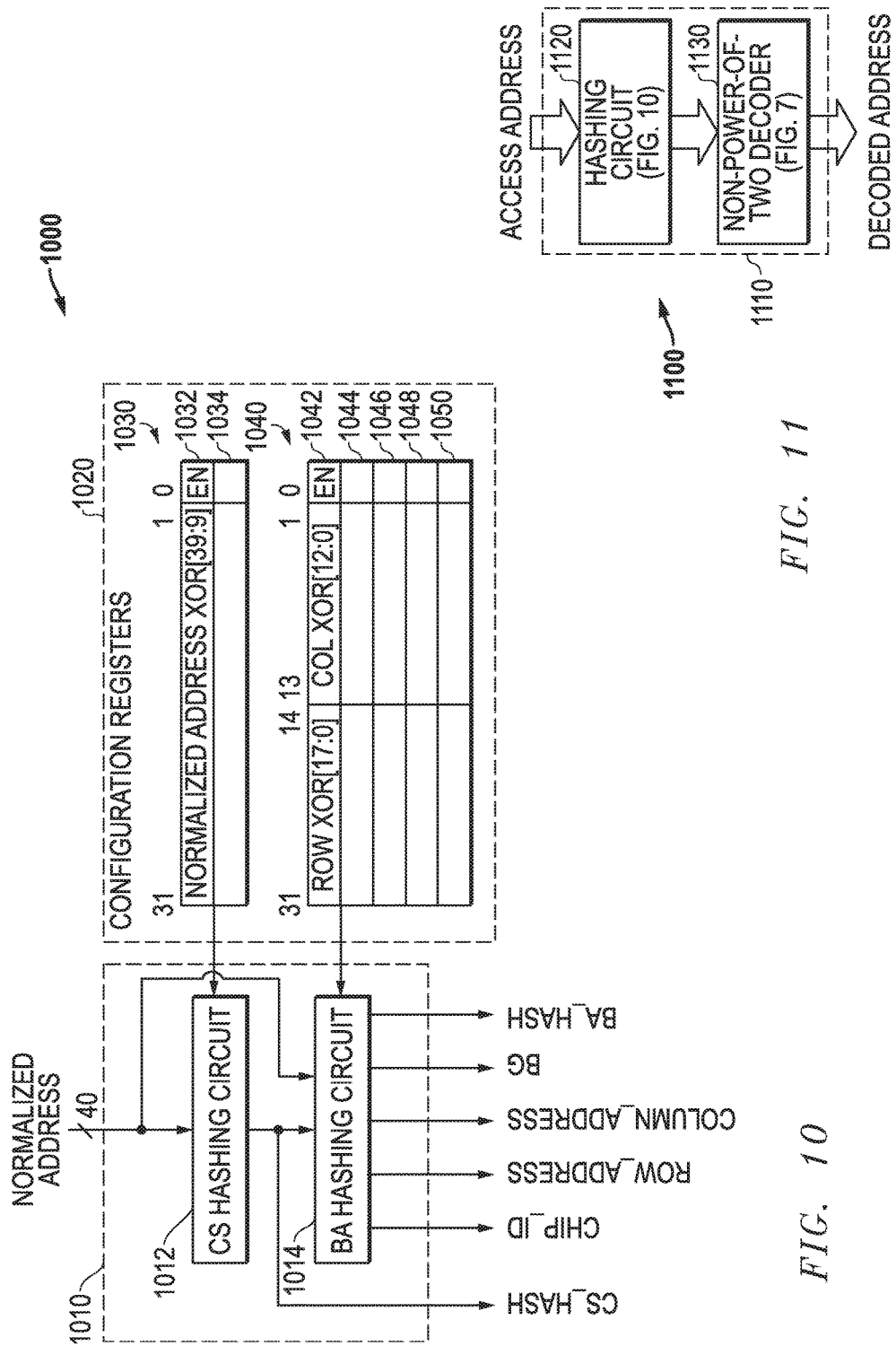
FIG. 10 illustrates in block diagram form an address decoder that can be used to implement the address decoder of FIG. 5 according to some embodiments.
FIG. 11 illustrates in block diagram form another address decoder that can be used to implement the address decoder of FIG. 5 according to some embodiments.

FIG. 10 illustrates in block diagram form a portion of a memory controller 1000 that can be used to implement address decoder 522 of FIG. 5 according to some embodiments. Memory controller 1000 includes an address decoder 1010 and a set of configuration registers 1020. Address decoder 1010 includes a chip select (CS) hashing circuit 1012 and a bank address (BA) hashing circuit 1014. CS hashing circuit 1012 has an input for receiving the 40-bit NORMALIZED ADDRESS from interface 512, and an output for providing a set of hashed chip select signals labeled "CS_HASH". BA hashing circuit 1014 has a first input connected to the output of CS hashing circuit 1012, a second input for receiving the NORMALIZED ADDRESS, and outputs for providing the CHIP_ID, ROW_ADDRESS, COLUMN_ADDRESS, BG, and BA_HASH signals. Memory controller 1000 provides decoded memory accesses using these outputs along with the CONTROL signals to command queue 520 to allow command queue 520 to store them so that arbiter 538 can make decisions about the efficient ordering of memory access requests.

Address decoder 1010 receives fields from various configuration registers for the base address and size of each memory chip in the memory channel as described above. In addition, address decoder 1010 uses additional configuration registers to support a programmable hashing function, and FIG. 10 shows only these additional configuration registers. In the illustrated embodiment, address decoder 1010 supports up to four chip select signals and up to thirty-two banks. Thus configuration registers 1020 include a set of two CS hash registers 1030 each corresponding to a bit of the encoded CS signal, and a set of five BA hash registers 1040, each corresponding to a bit of the encoded BA signal.

CS hash registers 1030 include a first CS hash register 1032 associated with CS_HASH[0] and a second CS hash register 1034 associated with CS_HASH[1]. Each CS hash register is a 32-bit register that includes a 30-bit field labeled "NORMALIZED ADDRESS XOR[39:9]" in register bits 31:1 and an enable field labeled "EN" in register bit 0. BA hash registers 1040 include BA hash registers 1042, 1044, 1046, 1048, and 1050 associated with hashed bank address bits BA_HASH[0], BA_HASH[1], BA_HASH[2], BA_HASH[3], and BA_HASH[4], respectively. Each BA hash register is a thirty-two bit register with three fields: an 18-bit row exclusive-OR (XOR) field labeled "ROWXOR [17:0]" in register bits 31:14, a 13-bit column XOR field labeled "COLXOR[12:0]" in register bits 13:1, and an enable field labeled "EN" in register bit 0.

Address decoder 1010 performs bitwise XOR operations using selected bits of the NORMALIZED ADDRESS. CS hashing circuit 1012 first hashes the chip select bits using selected ones of the most significant thirty-one bits of the NORMALIZED ADDRESS. Each bit of the NORMALIZED ADDRESS XOR field of the CS hash register is used to selectively perform a bitwise exclusive OR (XOR) operation on the indicated bits of the NORMALIZED ADDRESS. The two chip select signals are hashed according to equations [1] and [2] below:

$$CS\_HASH[0] = CS[0]\char`^(CS0\_XORENABLE \,\&\, \char`^(NORMADDR[39:9] \,\&\, CS0\_NORMADDRXOR))) \quad [1]$$

$$CS\_HASH[1] = CS[1]\char`^(CS1\_XORENABLE \,\&\, \char`^(NORMADDR[39:9] \,\&\, CS1\_NORMADDRXOR))) \quad [2]$$

in which ^ represents the XOR operator, and ^( ) represents the bitwise XOR operator on respective pairs of bits.

Memory decoder 1010 first locates the CS[1:0] bits based on the size of the memory. It then performs CS hashing to calculate the CS_HASH values using equations [1] and [2]. After CS hashing circuit 1012 determines the hashed CS_HASH values, BA hashing circuit 1014 performs BA hashing to calculate the BA_HASH values using equations [3]-[7]:

$$BA\_HASH[0] = BA[0]\char`^(BA\_XORENABLE \,\&\, \char`^(COL[12:0] \,\&\, BANK0\_COLXOR))\char`^(\char`^(ROW[17:0] \,\&\, BANK0\_ROWXOR)) \quad [3]$$

$$BA\_HASH[1]=BA[1]\hat{\,}(BA1\_XORENABLE\ \&\\ (\hat{\,}(COL[12:0]\&\ BANK1\_COLXOR))\hat{\,}(\hat{\,}(ROW\\ [17:0]\ \&\ BANK1\_ROWXOR)) \qquad [4]$$

$$BA\_HASH[2]=BA[2]\hat{\,}(BA2\_XORENABLE\ \&\\ (\hat{\,}(COL[12:0]\ \&\ BANK2\_COLXOR))\hat{\,}(\hat{\,}(ROW\\ [17:0]\ \&\ BANK2\_ROWXOR)) \qquad [5]$$

$$BA\_HASH[3]=BA[3]\hat{\,}(BA3\_XORENABLE\ \&\\ (\hat{\,}(COL[12:0]\ \&\ BANK3\_COLXOR))\hat{\,}(\hat{\,}(ROW\\ [17:0]\ \&\ BANK3\_ROWXOR)) \qquad [6]$$

$$BA\_HASH[4]=BA[4]\hat{\,}(BA4\_XORENABLE\ \&\\ (\hat{\,}(COL[12:0]\ \&\ BANK4\_COLXOR))\hat{\,}(\hat{\,}(ROW\\ [17:0]\ \&\ BANK4\_ROWXOR)) \qquad [7]$$

Note that the NORMALIZED ADDRESS bits corresponding to the CS bits cannot themselves be used to hash the CS bits, because otherwise it would force all CS_HASH values to be 0. An additional restriction on setting these register values will be described further below.

In some embodiments, the CS and BA hashing functions can be extended to additional levels of memory organization. For example, HBM memories implement a concept known as a "pseudo channel". The pseudo channel can be also hashed using a corresponding hashing equation and a corresponding pseudo channel register, as described in Equation [8] below:

$$PC\_HASH=PC\hat{\,}(PC\_XORENABLE\ \&\ (\hat{\,}(COL[12:0]\\ \&\ PC\_COLXOR))\hat{\,}(\hat{\,}(ROW[17:0]\ \&\\ PC\_ROWXOR))\hat{\,}(\hat{\,}(BANK[4:0]\ \&\\ PC\_BANKXOR)) \qquad [8]$$

In this case, the memory controller uses an additional hashing circuit and an additional configuration register.

Known memory controllers only hash bank addresses and use a fixed hashing function. Memory controller 1000 provides two additional mechanisms to increase its flexibility. First, memory controller 1000 selectively hashes chip selects to allow a greater flexibility in dividing accesses. For example, a memory with four ranks and four chip selects can be used to spread a set of proximal memory accesses more widely over four times more memory banks. This wider spreading allows memory controller 1000 to hide overhead better. Second, memory controller 1000 allows the hashing function itself to be programmable and therefore changeable to better fit the processing environment. For example, mobile systems tend to run a smaller number of tasks and to use a higher code and data concentration in the physical address space than desktop systems or servers, and therefore would benefit from a more complex hashing algorithm to ensure that more memory accesses to relatively small areas of physical memory are spread more widely across multiple chips and banks. On the other hand, desktop and server systems tend to be more multi-tasked and multi-threaded, so a simpler hashing algorithm may be sufficient. In either case, the hashing algorithm is programmable through a set of hashing registers that can be selectively programmed by the system BIOS.

FIG. 11 illustrates in block diagram form another portion of a memory controller 1100 that can be used to implement address decoder 522 of FIG. 5 according to some embodiments. As shown here memory controller 1100 includes an address decoder 1110 having a hashing circuit 1120 followed by a non-power-of-two decoder 1130. Hashing circuit 1120 has an input for receiving an access address and an output and can be implemented with hashing circuit 1010 of FIG. 10. Non-power-of-two decoder 1130 has an input connected to the output of hashing circuit 1120, and an output for providing a decoded address, and can be implemented with non-power-of-two decoder circuit 610 of FIGS. 6 and 7. Memory controller 1100 illustrates that not only can the hashing mechanism and the non-power-of-two memory size decoder be implemented separately, they also can be used together in a single memory decoder 1110. In this case, the hashing mechanism seamlessly precedes the non-power-of-two decoding to provide a memory controller with further enhanced flexibility by supporting both functions.

The hashing operation can also be used seamlessly with non power-of-two memory sizes. The way in which hashing circuit 1012 performs the hashing operation with a non-power-of-two memory address size can be described with respect to a particular example. In this example, a dual-rank 12 Gb memory is implemented using two region decoders, in which the first region decoder for CS0 maps to 12 Gb of the memory space using a primary decoder (CS0p) and a secondary decoder (CS0s), and a second region decoder for CS1 maps to 12 Gb of the memory space using a primary decoder (CS1p) and a secondary decoder (CS1s). In this example, the interleaving occurs in a straightforward fashion:

TABLE IV

| Register Name | Register Function | Original Map | Interleaved Map |
| --- | --- | --- | --- |
| BaseAddrCS0[39:8] | Base address register for CS0 primary decoder | 0x0_0000_00 | 0x0_0000_00 |
| BaseAddrCS1[39:8] | Base address register for CS1 primary decoder | 0x1_0000_00 | 0x0_0000_10 |
| BaseAddrSecCS0[39:8] | Base address register for CS0 secondary decoder | 0x2_0000_00 | 0x2_0000_00 |
| BaseAddrSecCS1[39:8] | Base address register for CS1 primary decoder | 0x2_8000_00 | 0x2_8000_10 |
| AddrMaskCS01[39:8] | Address mask for primary decoders for CS0 and CS1 | 0x0_FFFF_FF | 0x0_FFFF_EF |
| AddrMaskSecCS01[39:8] | Address mask for secondary decoders for CS0 and CS1 | 0x0_7FFF_FF | 0x0_FFFF_EF |

TABLE V

| NORMALIZED ADDRESS | Decoder | MSBs of HASHED ADDRESS |
| --- | --- | --- |
| 0x0000 | CS0p | 0x0 |
| 0x0001 | CS1p | 0x0 |
| 0x0002 | CS0p | 0x0 |
| 0x0003 | CS1p | 0x0 |
| 0x0004 | CS0p | 0x0 |
| 0x0005 | CS1p | 0x0 |
| 0x0006 | CS0p | 0x0 |
| 0x0007 | CS1p | 0x0 |
| 0x0008 | CS0p | 0x1 |
| 0x0009 | CS1p | 0x1 |

TABLE V-continued

| NORMALIZED ADDRESS | Decoder | MSBs of HASHED ADDRESS |
|---|---|---|
| 0x000A | CS0p | 0x1 |
| 0x000B | CS1p | 0x1 |
| 0x000C | CS0p | 0x1 |
| 0x000D | CS1p | 0x1 |
| 0x000E | CS0p | 0x1 |
| 0x000F | CS1p | 0x1 |
| 0x0010 | CS0s | 0x2 |
| 0x0011 | CS1s | 0x2 |
| 0x0012 | CS0s | 0x2 |
| 0x0013 | CS1s | 0x2 |
| 0x0014 | CS0s | 0x2 |
| 0x0015 | CS1s | 0x2 |
| 0x0016 | CS0s | 0x2 |
| 0x0017 | CS1s | 0x2 |

When the system BIOS configures non-power-of-two decoder 1130 to set up a non-power-of-two size, there is an additional restriction on the hashing function due to the DRAM architecture. For example according to the configuration illustrated in FIGS. 8 and 9, there are only 48K rows, and the ROWXOR bits corresponding to Row[MSB:MSB−1] should not be enabled for the hashing operation because it would not correctly translate the three states into the correct number of bank states. Instead these bits can only be used in memories with a power-of-two size.

Therefore the memory controller described above is able to perform flexible address mapping through a variety of configurable options, providing the user a range of choices. These address mapping choices include support for non power-of-two memory sizes, interleaving, and hashing, all of which are implemented in one combined decoder (address decoder 522).

The memory controller of FIGS. 5 and 6 may be implemented with various combinations of hardware and software. For example decoder 610 may be implemented with hardware circuitry for speed and efficiency purposes. This hardware circuitry may include priority encoders, finite state machines, programmable logic arrays (PLAs), and the like. In some embodiments, other functional blocks of memory controller 500 can be performed by a data processor under the control of software. Some of the software components may be stored in a computer readable storage medium for execution by at least one processor, and may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Memory controller 500 of FIG. 5 or address decoder 610 of FIG. 6 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, memory controller 500 may interface to other types of memory besides DDRx memory, such as high bandwidth memory (HBM), RAMbus DRAM (RDRAM), and the like as well as different types of DIMMs. Moreover memory controller 500 is scalable to access memories of different sizes. The number of power-of-two decoders will vary in other embodiments. While the illustrated embodiment described memory addressing and control signals useful in DDR memory, they will vary depending on the type of memory used. Also exemplary data processing system 100 was based on an APU having both CPU cores and GPU cores, such as APU 200 of FIG. 2, but the techniques described above also apply to CPUs (systems with one or more CPU cores but no GPU cores) and GPUs (systems with no CPU cores but one or more GPU cores).

Accordingly, it is intended by the appended claims to cover all modifications of the disclosed embodiments that fall within the scope of the disclosed embodiments.

What is claimed is:

1. An apparatus having a memory controller, the memory controller comprising:
   a host interface for receiving memory access requests, said memory access requests including access addresses;
   a memory interface for providing memory accesses to a memory system;
   an address decoder coupled to said host interface for programmably mapping said access addresses to selected ones of a plurality of regions using a hashing function, wherein said address decoder is responsive to a plurality of programmable bits to determine which of a corresponding plurality of bits of said access addresses are used in said hashing function, and is programmable to map said access addresses to a first region having a non-power-of-two memory address size using a primary decoder having a first power-of-two memory address size and a secondary decoder having a second power-of-two memory address size different from said first power-of-two memory address size, wherein said address decoder has a first region decoder comprising:
      a primary decoder for receiving said access addresses and providing a primary region select signal, wherein said primary decoder has a first base address and said first power-of-two memory address size; and
      a secondary decoder is for receiving said access addresses and providing a secondary region select signal, wherein said secondary decoder has a second base address and said second power-of-two memory address size; and
      a logic circuit for activating a first region mapping signal in response to an activation of at least one of said primary region select signal and said secondary region select signal;

a command queue coupled to said address decoder for storing said memory access requests and corresponding region mapping signals; and an arbiter for picking said memory access requests from said command queue based on a plurality of criteria, said plurality of criteria evaluated based in part on said corresponding region mapping signals, and providing corresponding memory accesses to said memory interface in response.

2. The apparatus of claim 1, wherein said address decoder comprises:

a hashing circuit having an input coupled to said host interface, and an output for providing access requests with hashed addresses; and a non-power-of-two decoder circuit responsive to said hashed addresses, and programmable to map said hashed addresses to said first region, and having an output for providing a first region mapping signal corresponding to said first region.

3. The apparatus of claim 2, wherein said hashing circuit comprises:

a chip select hashing circuit responsive to said access addresses and at least one programmable chip select hashing bit for hashing programmable portions of said access addresses to associate one hashed chip select signal with each access request; and a bank address hashing circuit responsive to said access addresses, said hashed chip select signal, and at least one programmable bank address hashing bit for hashing programmable portions of said access addresses to associate each access request with one bank in a chip corresponding to a selected hashed chip select.

4. The apparatus of claim 2, wherein said non-power-of-two decoder circuit is programmable to define said first region as a non power-of-two region and comprises a plurality of region decoders including said first region decoder, wherein for each region decoder comprises:

a corresponding primary decoder for receiving said access addresses and providing a corresponding primary region select signal, wherein said corresponding primary decoder has a respective base address and is programmable to have said first power-of-two memory address size;

a corresponding secondary decoder for receiving said access addresses and providing a corresponding secondary region select signal, wherein said corresponding secondary decoder has a respective second base address and is programmable to have said second power-of-two memory address size; and a corresponding logic circuit for activating a corresponding region mapping signal in response to an activation of at least one of said corresponding primary region select signal and said corresponding secondary region select signal.

5. The apparatus of claim 4, wherein:

said first region has a size of $2^N + 2^{(N-1)}$, and N is an integer;

said corresponding primary decoder decodes a sub-region of size $2^N$; and said corresponding secondary decoder decodes a region of size $2^{(N-1)}$.

6. The apparatus of claim 4, wherein said corresponding region mapping signals correspond to chip select signals of said memory system.

7. The apparatus of claim 6, wherein said non-power-of-two decoder circuit further decodes each of said access addresses to provide a row address, a column address, a bank address, and a bank group.

8. The apparatus of claim 1, wherein the apparatus is a data processing system further comprising:

a memory accessing agent for providing memory access requests, said memory access requests having said access addresses; and a memory system responsive to said memory accesses, said memory system having a plurality of regions including at least one non-power-of-two region.

9. The apparatus of claim 1, wherein the apparatus is a microprocessor formed on a single integrated circuit chip further comprising:

a memory accessing agent for providing said memory access requests, said memory access requests having access addresses.

10. An apparatus having a memory controller, the memory controller comprising:

a host interface for receiving memory access requests, said memory access requests including access addresses;

a memory interface for providing memory accesses to a memory system;

an address decoder coupled to said host interface for programmably mapping said access addresses to selected ones of a plurality of regions, wherein said address decoder is programmable to map said access addresses to a first region having a non-power-of-two memory address size using a primary decoder having a first power-of-two memory address size and a secondary decoder having a second power-of-two memory address size different from said first power-of-two memory address size, and provides a first region mapping signal in response, wherein said address decoder has a first region decoder comprising:

a primary decoder for receiving said access addresses and providing a primary region select signal, wherein said primary decoder has a first base address and said first power-of-two memory address size;

a secondary decoder is for receiving said access addresses and providing a secondary region select signal, wherein said secondary decoder has a second base address and said second power-of-two memory address size; and a logic circuit for activating said first region mapping signal in response to an activation of at least one of said primary region select signal and said secondary region select signal;

a command queue coupled to said address decoder for storing said memory access requests and corresponding region mapping signals; and an arbiter for picking said memory access requests from said command queue based on a plurality of criteria, said plurality of criteria evaluated based in part on said corresponding region mapping signals, and providing corresponding memory accesses to said memory interface in response.

11. The apparatus of claim 10, wherein said corresponding region mapping signals correspond to chip select signals of said memory system.

12. The apparatus of claim 10, wherein said address decoder comprises a plurality of region decoders including said first region decoder, wherein far each region decoder comprises:

a corresponding primary decoder is for receiving said access addresses and providing a corresponding primary region select signal, wherein said primary decoder has a first base address and said first power-of-two memory address size;

a corresponding secondary decoder is for receiving said access addresses and providing a corresponding secondary region select signal, wherein said corresponding secondary decoder has a respective second base address and said second power-of-two memory address size; and a corresponding logic circuit for activating a corresponding region mapping signal in response to an activation of at least one of said corresponding primary region select signal and said corresponding secondary region select signal.

13. The apparatus of claim 12, wherein:
said first region has a size of $2^N+2^{(N-1)}$, and N is an integer;
said corresponding primary decoder decodes a sub-region of size $2^N$; and
said corresponding secondary decoder decodes a region of size $2^{(N-1)}$.

14. The apparatus of claim 12, wherein said address decoder further decodes each of said access addresses to provide a row address, a column address, a bank address, and a bank group.

15. The apparatus of claim 12, wherein each region decoder further comprises:
a first set of configuration registers associated with said primary decoder; and
a second set of configuration registers associated with said secondary decoder.

16. The apparatus of claim 10, further comprising:
a first region decoder for selectively mapping said access addresses to a first region having a power-of-two memory address size using a first primary decoder having a third power-of-two memory address size and a first secondary decoder having said third memory address power-of-two size, and providing said first region mapping signal in response; and
a second region decoder for selectively mapping said access addresses to a second region having a power-of-two memory address size using a second primary decoder having said third power-of-two memory address size and a second secondary decoder having said third power-of-two memory address size, and providing a second region mapping signal in response,
wherein said memory controller interleaves a memory space corresponding to said access addresses among each of said first primary decoder, said second primary decoder, said first secondary decoder, and said second secondary decoder.

17. The apparatus of claim 10, wherein the apparatus is a data processing system further comprising:
a memory accessing agent for providing memory access requests, said memory access requests having said access addresses; and
a memory system responsive to said memory accesses, said memory system having a plurality of regions including at least one non-power-of-two region.

18. The apparatus of claim 10, wherein the apparatus is a microprocessor formed on a single integrated circuit chip further comprising:
a memory accessing agent for providing said memory access requests, said memory access requests having access addresses.

19. A method, comprising:
receiving memory access requests, said memory access requests including access addresses;
decoding said access addresses and providing corresponding region mapping signals in response, wherein said decoding includes selectively and programmably mapping said access addresses to a first region having a non-power-of-two memory address size using a first primary decoder having a first power-of-two memory address size and a first secondary decoder having a second power-of-two memory address size different from said first power-of-two memory address size, wherein said decoding comprises:
decoding a first access address and providing a primary region select signal if said first access address falls within a first sub-region defined by a first base address and said first power-of-two memory address size;
decoding said first access address and providing a secondary region select signal if an access address falls within a second sub-region defined by a second base address and said second power-of-two memory address size; and
activating a selected region mapping signal in response to an activation of at least one of said primary region select signal and said secondary region select signal,
providing a first region mapping signal in response to mapping said access addresses to said first region;
storing said memory access requests and said corresponding region mapping signals;
picking said memory access requests, so stored, based on a plurality of criteria, said plurality of criteria evaluated based in part on said corresponding region mapping signals; and
providing corresponding memory accesses in response to said picked memory access requests.

20. The method of claim 19, further comprising:
activating selected ones of a plurality of chip select signals in response to said corresponding region mapping signals of said picked memory access requests.

21. The method of claim 19, wherein each of said decoding said first access address and providing said primary region select signal and decoding said first access address and providing said secondary region select signal comprises:
decoding said first access address to provide a row address, a column address, a bank address, and a bank group.

22. The method of claim 19, further comprising:
selectively mapping said access addresses to said first region having a power-of-two memory address size using said first primary decoder having a third power-of-two memory address size and said first secondary decoder having said third power-of-two memory address size, and providing said first region mapping signal in response; and
selectively mapping said access addresses to a second region having a power-of-two memory address size using a second primary decoder having said third power-of-two memory address size and a second secondary decoder having said third power-of-two memory address size, and providing a second region mapping signal in response,
wherein each of said selectively mapping said access addresses to said first region and said selectively mapping said access addresses to said second region comprises interleaving a memory space corresponding to said access addresses among said first primary decoder, said second primary decoder, said first secondary decoder, and said second secondary decoder.

23. The method of claim 19, wherein said decoding further comprises:
selectively hashing said access addresses using a hashing function responsive to a plurality of programmable bits to determine which of a corresponding plurality of bits of said access addresses are used in said hashing function.

* * * * *